United States Patent
Kuramachi et al.

(10) Patent No.: US 8,133,577 B2
(45) Date of Patent: Mar. 13, 2012

(54) SILICON-NITROGEN COMPOUND FILM, AND GAS-BARRIER FILM AND THIN-FILM DEVICE USING THE SILICON-NITROGEN COMPOUND FILM

(75) Inventors: Teruhiko Kuramachi, Ashigarakami-gun (JP); Tomoo Murakami, Ashigarakami-gun (JP); Takeshi Senga, Minamiashigara (JP); Jiro Tsukahara, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 183 days.

(21) Appl. No.: 12/261,727

(22) Filed: Oct. 30, 2008

(65) Prior Publication Data

US 2009/0110896 A1    Apr. 30, 2009

(30) Foreign Application Priority Data

Oct. 30, 2007    (JP) .................... 2007-281970

(51) Int. Cl.
    *B32B 9/00*    (2006.01)
(52) U.S. Cl. ........ 428/220; 428/332; 428/698; 428/145; 428/446
(58) Field of Classification Search .................. None
    See application file for complete search history.

(56) References Cited

U.S. PATENT DOCUMENTS

| | | | |
|---|---|---|---|
| 2,681,294 A | | 6/1954 | Beguin |
| 5,181,096 A * | | 1/1993 | Forouhi ...................... 257/530 |
| 6,083,628 A | | 7/2000 | Yializis |
| 6,198,217 B1* | | 3/2001 | Suzuki et al. ................ 313/504 |
| 6,214,422 B1 | | 4/2001 | Yializis |
| 7,074,501 B2* | | 7/2006 | Czeremuszkin et al. ..... 428/690 |
| 2002/0180924 A1* | | 12/2002 | Sobrinho ...................... 349/158 |
| 2004/0021820 A1* | | 2/2004 | Sobrinho ...................... 349/158 |
| 2004/0046497 A1 | | 3/2004 | Schaepkens et al. |
| 2004/0195960 A1* | | 10/2004 | Czeremuszkin et al. ..... 313/504 |
| 2005/0032301 A1* | | 2/2005 | Udayakumar et al. ........ 438/240 |
| 2005/0205906 A1* | | 9/2005 | Udayakumar et al. ........ 257/295 |
| 2006/0138603 A1* | | 6/2006 | Cabral et al. .................. 257/635 |
| 2006/0251905 A1 | | 11/2006 | Arakawa |
| 2008/0193747 A1* | | 8/2008 | MacDonald et al. ......... 428/336 |

FOREIGN PATENT DOCUMENTS

| | | |
|---|---|---|
| JP | 11-149826 A | 6/1999 |
| JP | 2002-322561 A | 11/2002 |
| JP | 2002-361774 A | 12/2002 |
| JP | 3400324 B2 | 2/2003 |

(Continued)

OTHER PUBLICATIONS

Schmidt et al. J. Phys. Condens. Matter 16, 2004, pp. 4233-4244.*

(Continued)

*Primary Examiner* — Jennifer McNeil
*Assistant Examiner* — Vera Katz
(74) *Attorney, Agent, or Firm* — Sughrue Mion, PLLC

(57) ABSTRACT

A silicon-nitrogen compound film according to the first aspect of the present invention is made of a material expressed by a compositional formula $Si_3N_xO_yH_z$, where $10 \leq (3x+2y) \leq 12$, $3.4 \leq x \leq 4.0$, $0 \leq y$, $0 \leq z < 2.0$, the peak-area ratio of a first area of a first peak appearing near a wave number of 2150 $cm^{-1}$ in a Fourier-transform infrared absorption spectrum of the material and corresponding to a Si—H stretching vibration to a second area of a second peak appearing near a wave number of 810 $cm^{-1}$ in the Fourier-transform infrared absorption spectrum and corresponding to a Si—N stretching vibration is smaller than 0.2, and the silicon-nitrogen compound film has a thickness t (in nanometers) and a density d (g/cm$^3$) which satisfy the inequalities, $1.9 \leq d \leq 2.5$, and $-700d+1930 \leq 6t \leq -700d+2530$.

5 Claims, 5 Drawing Sheets

FOREIGN PATENT DOCUMENTS

| | | |
|---|---|---|
| JP | 2003-105541 A | 4/2003 |
| JP | 2004-292877 A | 10/2004 |
| WO | WO2006097733 * | 9/2006 |

OTHER PUBLICATIONS

Min et al. Applied Surface Science, 117/118, 1997, pp. 638-641.*

Schmidt et al. Thin Solid Films vol. 450, 2004, pp. 346-351.*

Stannowski et al. Mat. Res. Soc. Symp. Proc. vol. 557, 1999 pp. 659-664.*

T.W. Kim et al., "Transparent hybrid inorganic/organic barrier coatings for plastic organic light-emitting diode substrates", Journal of Vacuum Science and Technology A, 2005 Jul./Aug., pp. 971-977, vol. 23, No. 4.

* cited by examiner

SILICON-NITROGEN COMPOUND FILM, AND GAS-BARRIER FILM AND THIN-FILM DEVICE USING THE SILICON-NITROGEN COMPOUND FILM

BACKGROUND OF THE INVENTION

1. Field of the Invention

The present invention relates to a silicon-nitrogen compound film exhibiting low gas permeability and satisfactory gas-barrier performance, a gas-barrier film using the silicon-nitrogen compound film, and a thin-film device using the gas-barrier film.

2. Description of the Related Art

Currently, various flexible devices are receiving attention. The use of the flexible devices is widely spread, where the flexible devices include, for example, electronic paper, liquid crystal displays, and the electroluminescence (EL) devices.

Basically, the flexible devices have a structure with a thin film of a crystalline semiconductor or metal which is formed in a pattern over a flexible substrate such as a resin substrate. Since the resin substrate exhibits lower gas-barrier performance than the inorganic substrate such as the glass substrate, the resin substrate cannot stop air and water in the air, so that air and water in the air is likely to penetrate through the substrate into the flexible device. When the air or water in the air penetrates into the flexible device, the air or water can affect the element characteristics of the flexible device, and defects or durability reduction can occur. Therefore, it is common to arrange a gas-barrier film or the like in the flexible device for suppressing the penetration of air or water in the air onto the resin substrate. The gas-barrier film is realized by, for example, a silicon-nitrogen compound film such as a silicon-nitride film expressed as $SiN_x$ and a silicon-oxynitride film expressed as $SiON_x$, and various silicon-nitrogen compound films exhibiting satisfactory gas-barrier performance are currently being studied.

Japanese Unexamined Patent Publication No. 2004-292877 (hereinafter referred to as JP2004-292877) discloses a silicon-nitride film which is formed by chemical vapor deposition, satisfies the condition $1.05 \leq x \leq 1.33$ in the composition expressed as $SiN_x$, and has a refractive index of 1.8 to 1.96. JP2004-292877 reports that the disclosed silicon-nitride film exhibits high capability of stopping penetration of water vapor and oxygen. (See paragraph No. 0063 in JP2004-292877.)

Japanese Unexamined Patent Publication No. 2003-105541 (hereinafter referred to as JP2003-105541) discloses a silicon-oxynitride film which is formed by vapor deposition using atmospheric-pressure plasma, and satisfies the condition that the value of $x/(x+y)$ does not exceed 0.95, where the molar ratio between the oxygen atoms and the nitrogen atoms constituting the silicon-oxynitride film is $x{:}y$. JP2003-105541 reports that the disclosed silicon-oxynitride film has high flexibility and density, and is resistant to of water penetration. (See paragraph No. 0068 in JP2003-105541.)

Recently, the size of the liquid crystal display has been increasing. In addition, it is known that the element characteristics of the organic EL devices, the organic solar cells, the CIGS (copper indium gallium selenium) solar cells, and the like are likely to be affected by water vapor and oxygen. Therefore, the gas-barrier film arranged in the thin-film device is required to exhibit higher gas-barrier performance. The gas-barrier performance can be evaluated by the water-vapor transmission rate (WVTR). Currently, the WVTR not exceeding $10^{-6}$ g/m$^2$/day is required in the organic EL devices. In the fields in which high gas-barrier performance is required, it is common to achieve a desired value of the WVTR by laminating more than one silicon-nitride film through one or more organic layers. Therefore, in consideration of the structure of the device, each gas-barrier film is required to exhibit the gas-barrier performance corresponding to the WVTR not exceeding $10^{-3}$ g/m$^2$/day from the viewpoint of downsizing.

However, in JP2004-292877 and JP2003-105541, the gas-barrier performance is not evaluated on the basis of the WVTR. Specifically, the gas-barrier performance is evaluated on the basis of the etching rate in etching with buffered fluoric acid in JP2004-292877, and on the basis of the deterioration in the luminosity of the element in JP2003-105541 by actually arranging the gas-barrier film in the element. In the evaluation performed in JP2004-292877, only the density (compactness) of the film is evaluated, and the other factors are not considered. Therefore, the true permeability of air and water vapor are unknown. In the evaluation performed in JP2003-105541, factors other than the gas-barrier performance are considered to be able to affect the deterioration of the element. Therefore, in JP2003-105541, the gas-barrier performance per se is not evaluated, so that the true permeability of air and water vapor are unknown. Actually, the WVTR value of the silicon-nitride film disclosed in JP2003-105541 has been confirmed as exceeding $10^{-3}$ g/m$^2$/day.

Further, the silicon-nitride film disclosed in JP2004-292877 is formed by a special chemical vapor deposition technique, in which raw material gas is catalytically decomposed by using energized heating wires. There is a general tendency for films formed by such a special chemical vapor deposition technique to exhibit higher uniformity in the conditions of various types of bonds between atoms such as the Si—Si, Si—H, and Si—N bonds than the films formed by the other film-formation techniques. Since the conditions of various types of bonds between atoms affect the density (compactness) of the film and the contamination rate, the gas-barrier performance is different according to the conditions of various types of bonds between atoms. Therefore, the films formed by the other film-formation techniques cannot he expected to have the same composition as the silicon-nitride film disclosed in JP2004-292877.

SUMMARY OF THE INVENTION

The present invention has been developed in view of the above circumstances.

The first object of the present invention is to provide a silicon-nitrogen compound film which exhibits a water-vapor transmission rate (WVTR) not exceeding $10^{-3}$ g/m$^2$/day, and is preferable for use as a gas-barrier film in a thin-film device.

The second object of the present invention is to provide a gas-barrier film using the silicon-nitrogen compound film which achieves the first object.

The third object of the present invention is to provide a thin-film device using the gas-barrier film which achieves the second object.

(I) In order to accomplish the first object, a silicon-nitrogen compound film according to the first aspect of the present invention is provided. The silicon-nitrogen compound film according to the first aspect of the present invention is made of a material which is expressed by a compositional formula $Si_3N_xO_yH_z$ and may contain inevitable impurities, where x, y, and z satisfy $10 \leq (3x+2y) \leq 12$, $3.4 \leq x \leq 4.0$, $0 \leq y$, and $0 \leq z < 2.0$, the peak-area ratio of the area of a first peak appearing near a wave number of 2150 cm$^{-1}$ in a Fourier-transform infrared absorption spectrum of the material and corresponding to a Si—H stretching vibration to the area of a second peak appearing near a wave number of 810 cm$^{-1}$ in the Fourier-transform infrared absorption spectrum and corresponding to a Si—N stretching vibration is smaller than 0.2, and the silicon-nitrogen compound film has a thickness t (in nanometers) and a density d (g/cm$^3$) which satisfy the inequalities, $$1.9 \leq d \leq 2.5, \text{ and} \quad (1)$$

$$-700d+1930 \leq 6t \leq -700d+2530. \quad (2)$$

In this specification, the expression "Fourier-transform infrared absorption spectrum" means an infrared absorption spectrum obtained by the single-reflection ATR (attenuated total reflection) technique and Fourier-transform infrared spectroscopy.

In addition, the area of a peak in a Fourier-transform infrared absorption spectrum means the area of the peak which is obtained by removing the background from each peak in the Fourier-transform infrared absorption spectrum and separating each peak. In the case where a peak of a Si—O stretching vibration near the wave number of 1000 to 1100 cm$^{-1}$ overlaps a peak of a Si—N stretching vibration near the wave number of 810 to 840 cm$^{-1}$, and cannot be separated from the peak of the Si—N stretching vibration, the area of the peak of the Si—O stretching vibration is assumed to be zero.

Further, in this specification, the silicon-nitrogen compound films include the silicon-nitride films, the silicon-oxynitride films, and films having nonstoichiometric compositions (for example, containing inevitable impurities such as hydrogen atoms) as well as the films having stoichiometric compositions. (For example, the silicon nitride having a stoichiometric composition is Si$_3$N$_4$). The compositional formula Si$_3$N$_x$O$_y$H$_z$ indicates the compositions which do not contain inevitable impurities other than the hydrogen atoms. In the compositional formula Si$_3$N$_x$O$_y$H$_z$, x, y, and z normally satisfy the condition expressed as 3x+2y+z=12. However, the composition of the silicon-nitrogen compound film according to the first aspect of the present invention may deviate from the above condition due to inclusion of inevitable impurities or occurrence of defects during formation of the silicon-nitrogen compound film.

The silicon-nitrogen compound film according to the first aspect of the present invention can have a water-vapor transmission rate not exceeding 10$^{-3}$ g/m$^2$/day. In this specification, the gas-barrier performance is evaluated on the basis of the water-vapor transmission rate at the measurement temperature of 40° C. and the relative humidity of 90%.

In order to accomplish the second object, a gas-barrier film according to the second aspect of the present invention is provided. The gas-barrier film according to the second aspect of the present invention comprises one or more silicon-nitrogen compound films and one or more organic films which are alternately laminated, where each of the one or more silicon-nitrogen compound films is the silicon-nitrogen compound film according to the first aspect of the present invention.

The gas-barrier film according to the second aspect of the present invention can have a water-vapor transmission rate not exceeding 10$^{-6}$ g/m$^2$/day.

In order to accomplish the third object, a gas-barrier film according to the third aspect of the present invention is provided. The thin-film device according to the third aspect of the present invention comprises; a substrate having one or more organic films; and the gas-barrier film according to the second aspect of the present invention formed over the substrate.

(II) The advantages of the present invention are described below.

According to the first aspect of the present invention, a silicon-nitrogen compound film having a water-vapor transmission rate not exceeding 10$^{-3}$ g/m$^2$/day can be produced by preferably setting the thickness and the density of the silicon-nitrogen compound film and the molar fractions of oxygen atoms and hydrogen atoms in the silicon-nitrogen compound film. Such a silicon-nitrogen compound film is preferable for use as a gas-barrier film in a thin-film device such as an organic EL device. Therefore, according to the present invention, it is possible to easily produce a silicon-nitrogen compound film exhibiting superior gas-barrier performance.

Since the silicon-nitrogen compound film according to the first aspect of the present invention has a water-vapor transmission rate not exceeding 10$^{-3}$ g/m$^2$/day, and the gas-barrier film according to the second aspect of the present invention is constituted by the alternately laminated structure of the one or more silicon-nitrogen compound films and the one or more organic films, the gas-barrier film can have the water-vapor transmission rate not exceeding 10$^{-6}$ g/m$^2$/day.

DESCRIPTION OF PREFERRED EMBODIMENTS

Figure 1:
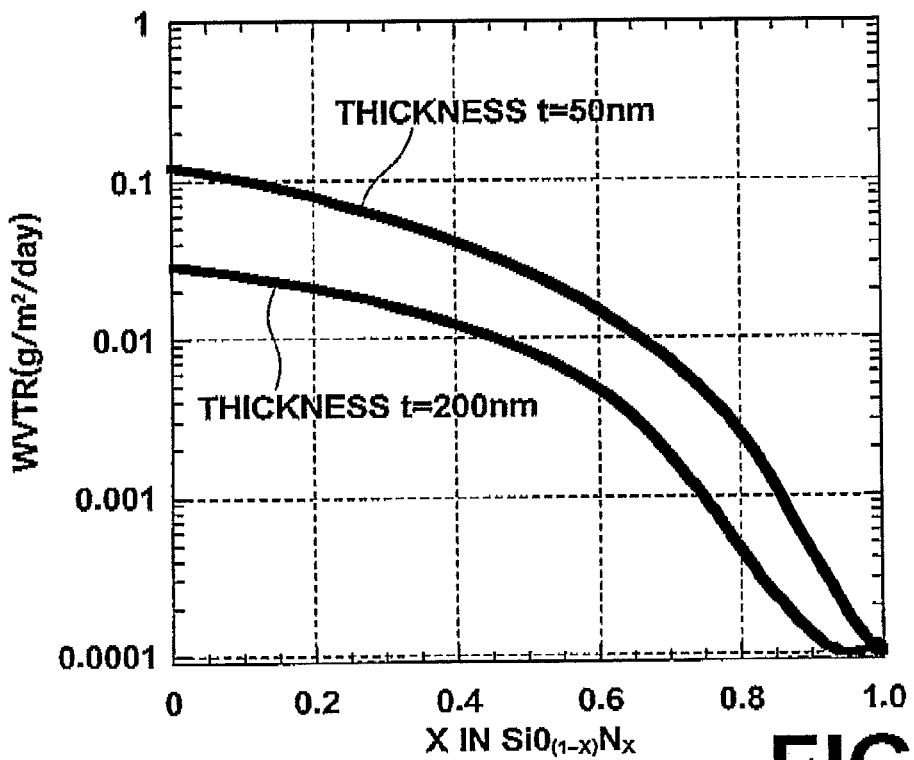
FIG. 1 is a graph indicating relationships between the molar fraction of oxygen atoms in silicon-nitrogen compound films and the water-vapor transmission rate of the silicon-nitrogen compound films.

1. Silicon-nitrogen Compound Film
1.1 General Requirements of the Present Invention The silicon-nitrogen compound film according to the first aspect of the present invention is made of a material which is expressed by a compositional formula $Si_3N_xO_yH_z$ and may contain inevitable impurities, where x, y, and z satisfy $10 \leq (3x+2y) \leq 12$, $3.4 \leq x \leq 4.0$, $0 \leq y$, and $0 \leq z < 2.0$, the peak-area ratio of the area of a first peak appearing near a wave number of 2150 cm$^{-1}$ in a Fourier-transform infrared absorption spectrum (FTIR spectrum) of the material and corresponding to a Si—H stretching vibration to the area of a second peak appearing near a wave number of 810 cm$^{-1}$ in the FTIR spectrum and corresponding to a Si—N stretching vibration is smaller than 0.2, and the silicon-nitrogen compound film has a thickness t (nm) and a density d (g/cm$^3$) which satisfy the inequalities, $$1.9 \leq d \leq 2.5, \text{ and} \quad (1)$$

$$-700d+1930 \leq 6t \leq -700d+2530. \quad (2)$$

The present inventors have found that a silicon-nitrogen compound film having a water-vapor transmission rate not exceeding $10^{-3}$ g/m$^2$/day can be produced by preferably setting the factors of the molar amounts of oxygen atoms, nitrogen atoms, and hydrogen atoms in the silicon-nitrogen compound film and the thickness and the density of the silicon-nitrogen compound film Such a silicon-nitrogen compound film is preferable for use in a gas-barrier film in a thin-film device such as an organic EL device. Hereinbelow, preferable conditions of the respective factors are explained.

1.2 Amount of Oxygen Atoms

The present inventors have produced silicon-nitrogen compound films having various compositions by using chemical vapor deposition and varying the composition of the raw-material gas, and clarified the relationship between the permeability of the water molecules constituting water vapor and the ratio between the molar fractions of oxygen atoms and nitrogen atoms in each silicon-nitrogen compound film (as indicated in FIG. 1). The permeability of the water molecules are evaluated by using the water-vapor transmission rate (WVTR). FIG. 1 indicates relationships between the molar fraction of nitrogen atoms relative to the sum of the molar fractions of the nitrogen atoms and oxygen atoms in silicon-nitrogen compound films and the water-vapor transmission rate, where the relationships are obtained for the silicon-nitrogen compound films respectively having the thicknesses of 50 nm and 200 nm, and the densities of the silicon-nitrogen compound films are 2.2±0.1 g/cm$^3$. In FIG. 1, the hydrogen atoms which can be contained in the silicon-nitrogen compound films are not considered.

The thicknesses of the films referred to in this specification have been measured by observation of ultrathin sections of samples of the films by using the scanning electron microscope S-900, which is available from Hitachi High-Technologies Corporation. The densities of the films have been calculated from X-ray reflectance values obtained by preparing evaluation samples (each of which contains one or more inorganic layers formed over a Si wafer) and using the X-ray diffraction measurement system ATX-G, which is available from Rigaku Corporation.

In addition, the values of the water-vapor transmission rate (WVTR) have been measured (at the measurement temperature of 40° C. and the relative humidity of 90%) by using the instrument PERMATRAN-W3/31, which is available from Modern Controls Inc. (MOCON). Further, the values of the WVTR smaller than the measurement limit (0.01 g/m$^2$/day) of the above instrument have been supplemented in the following manner.

First, a specimen for measurement has been produced by evaporating metal calcium directly on a gas-barrier film, and sealing the gas-barrier film and a glass substrate with a commercially available sealant prepared for sealing organic EL devices so that the evaporated metal calcium is located inside. Then, the specimen for measurement has been held at the temperature of 40° C. and the relative humidity of 90%, and variations in the optical density of the metal calcium formed on the gas-barrier film have been measured. Finally, the WVTR values have been calculated on the basis of the measured variations in the optical density of the metal calcium. That is, the WVTR values have been evaluated on the basis of the reduction in the metallic luster caused by hydroxylation or oxidation.

As indicated in FIG. 1, the WVTR value increases with increase in the molar fraction 1-x of oxygen atoms in the silicon-nitrogen compound film. The present inventors consider that the existence of the oxygen atoms lowers the energy barrier when the water molecules pass through the film, and therefore increases the WVTR value.

In order to verity the results indicated in FIG. 1, the present inventors have calculated, by use of simulation using a semiempirical molecular orbital method, the energy barriers against passage of water molecules when the water molecules pass through a $SiO_2$ film, a $Si_2ON_2$ film, and a $Si_3N_4$ film, respectively. The calculated results indicate that the energy barrier heights $B(SiO_2)$, $B(Si_2ON_2)$, and $B(Si_3N_4)$ of the $SiO_2$ film, the $Si_2ON_2$ film, and the $Si_3N_4$ film have relationships as $B(SiO_2) < B(Si_2ON_2) < B(Si_3N_4)$. That is, the increase in the molar fraction of oxygen atoms decreases the energy barrier height, and eases the permeation of the water molecules.

The results indicated in FIG. 1 and the result of the above simulation indicate that the molar fraction of oxygen atoms is preferably smaller from the viewpoint of the WVTR. Since the WVTR of the silicon-nitrogen compound film according to the present invention does not exceed $10^{-3}$ g/m$^2$/day, the results indicated in FIG. 1 show that the molar fraction of nitrogen atoms relative to the sum of the molar fractions of the nitrogen atoms and oxygen atoms in silicon-nitrogen compound films should be 0.85 or greater. This means that the nitrogen composition x in the composition $Si_3N_xO_yH_z$ of the silicon-nitrogen compound film according to the present invention should be 3.4 or greater. In addition, in the silicon-nitrogen compound film containing a small molar fraction of oxygen atoms, there is a tendency for the transparency to decrease with increase in the density of the silicon-nitrogen compound film. Therefore, it is preferable that the molar fraction of oxygen atoms be determined in consideration of the transparency within the above range of the WVTR.

Further, FIG. 1 shows that the silicon-nitrogen compound film having the thickness of 200 nm has a smaller WVTR value (and exhibits higher gas-barrier performance) than the silicon-nitrogen compound film having the thickness of 50 nm. Since the energy barrier height of the silicon-nitrogen compound film can be estimated as the product of the thickness and the energy barrier height per thickness, the WVTR value is considered to decrease with increase in the thickness. However, since the silicon-nitrogen compound film is an inorganic film, the flexibility of the silicon-nitrogen compound film is poor. Therefore, when the thickness increases, cracks are likely to be produced by membrane stress caused by bending and the like. Thus, the advantage of the greater thickness can be used only within the range in which the possibility of occurrence of a crack caused by membrane stress is not high. The influence of the film thickness on the occurrence of a crack is further explained in detail later.

1.3 Amount of Hydrogen Atoms

The present inventors have noticed that reaction of water molecules with the Si—H bonds in the silicon-nitrogen compound film is likely to occur, and investigated the influence of the Si—H bonds in the silicon-nitrogen compound film on the WVTR. For example, in the case where the silicon-nitrogen compound film is formed by chemical vapor deposition, when the chemical reaction in the vapor phase or at the surface of the substrate is insufficient, hydrogen atoms are mixed into the film, and Si—H bonds are produced in the silicon-nitrogen compound film. Therefore, films having compositions other than the stoichiometric compositions, as well as the films having stoichiometric compositions, are commonly included in the silicon-nitrogen compound films. The present inventors have found that the reactivity of each Si—H bond (SiH) with water molecules varies with the condition of the binding of the Si atom in the Si—H bond to one or more other atoms, and the strengths $R(N_3\text{—SiH})$, $R(N_2Si\text{—SiH})$, $R(NSi\text{—SiH}_2)$, and $R(Si_2\text{—SiH}_2)$ of the reactivities, with water molecules, of the Si—H bonds in which the Si atoms are respectively bound to $N_3$, $N_2Si$, $NSi$, and $Si_2$ have relationships indicated by the inequalities,

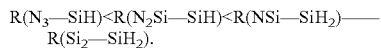

$$R(N_3\text{—SiH}) < R(N_2Si\text{—SiH}) < R(NSi\text{—SiH}_2) = R(Si_2\text{—SiH}_2).$$

Thus, the total reactivity with water molecules increases with increase in the Si—H bonds. Therefore, it is more preferable that the amount of the Si—H bonds in the silicon-nitrogen compound film be smaller. The present inventors consider that when the silicon-nitrogen compound film contains a great amount of Si—H bonds, the Si—H bonds react with water molecules, and therefore oxygen atoms are captured by the silicon-nitrogen compound film, so that the WVTR value increases.

The amount of the Si—H bonds in the silicon-nitrogen compound film can be analyzed on the basis of the area of the peak corresponding to the Si—H bond in an FTIR (Fourier-transform infrared) absorption spectrum of the silicon-nitrogen compound film. (See the concrete examples which are explained later with reference to FIGS. 9 and 10.) Since the Si—H bonds in the silicon-nitrogen compound film are located at the places at which Si—N bonds should be originally located, the amount of the Si—H bonds in the silicon-nitrogen compound film can be evaluated on the basis of the ratio Sh/Sn of the area Sh of the first peak appearing near the wave number of 2150 $cm^{-1}$ in the FTIR absorption spectrum and corresponding to a Si—H stretching vibration to the area Sn of the second peak appearing near the wave number of 810 $cm^{-1}$ in the FTIR absorption spectrum and corresponding to a Si—N stretching vibration It is more preferable that the ratio Sh/Sn be smaller.

Figure 2:
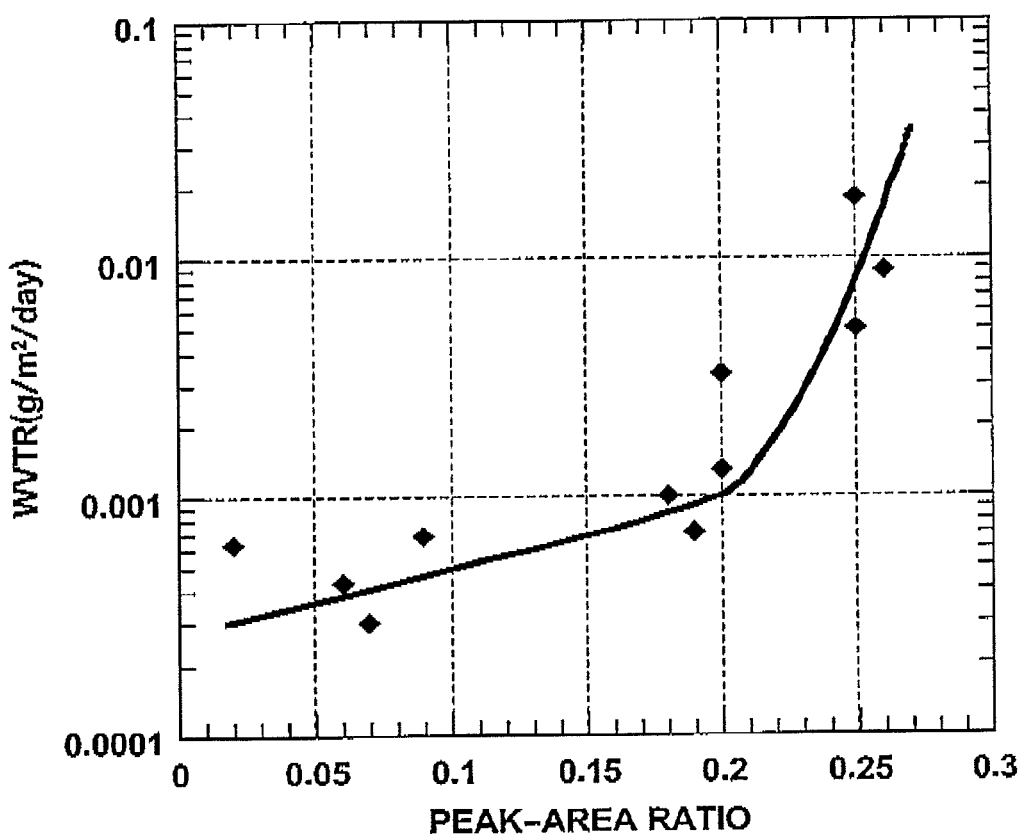
FIG. 2 is a graph indicating a relationship between the water-vapor transmission rate of a silicon-nitrogen compound film and the peak-area ratio of the area of a peak corresponding to a Si—H stretching vibration to the area of a peak corresponding to a Si—N stretching vibration in a Fourier-transform infrared absorption spectrum (FTIR spectrum).

The present inventors have measured the WVTR values of a plurality of silicon-nitrogen compound films having a thickness of 100 nm and respectively having different FTIR spectra, and obtained a relationship between the WVTR values and the values of the ratio Sh/Sn as indicated in FIG. 2. In the silicon-nitrogen compound films of FIG. 2, the values of the ratio Sh/Sn are differentiated by changing the composition of raw-material gas.

As indicated in FIG. 2, when the value of the ratio Sh/Sn is greater than 0.2, the WVTR value exceeds $10^{-3}$ $g/m^2/day$. In particular, the WVTR value suddenly increases when the ratio Sh/Sn exceeds 0.2. Therefore, in the silicon-nitrogen compound film according to the present invention, the ratio Sh/Sn is limited so as to be smaller than 0.2. Although the relationship of FIG. 2 is obtained from the silicon-nitrogen compound films having a thickness of 100 nm, it is possible to consider that similar relationships exist within the range in which the possibility of occurrence of a crack caused by membrane stress is not high.

1.4 Thickness and Density

The thickness and density of the silicon-nitrogen compound film are factors which greatly affect the gas-barrier performance. When the silicon-nitrogen compound film has no crack, the gas-barrier performance is improved as the thickness and/or density increases. However, as mentioned before, since the silicon-nitrogen compound film is an inorganic film, the flexibility of the silicon-nitrogen compound film is poor. Therefore, when the thickness increases, cracks become more likely to be produced by membrane stress caused by bending and the like. When a crack is produced, exfoliation is likely to occur. In addition, since air and water can penetrate through the crack and degrade the element characteristics, the silicon-nitrogen compound film must have such a thickness that cracks are unlikely to be produced by membrane stress. On the other hand, in the case where the thickness is small, there is no fear of the crack, and the productivity is high. However, when the thickness is too small, the energy barrier height is too small, so that water molecules in the air can easily penetrate through the silicon-nitrogen compound film. The energy barrier height also varies with the density of the silicon-nitrogen compound film. That is, the energy barrier height increases with the density even when the thickness is unchanged. Therefore, it is preferable that the thickness and the density of the silicon-nitrogen compound film be determined so that the silicon-nitrogen compound film has an energy barrier which realizes satisfactory gas-barrier performance.

In order to determine a combination of the thickness and the density which realizes satisfactory gas-barrier performance, the present inventors have made an investigation of the silicon-nitrogen compound film containing oxygen and hydrogen atoms within the ranges according to the present invention, as explained below.

Figure 3:
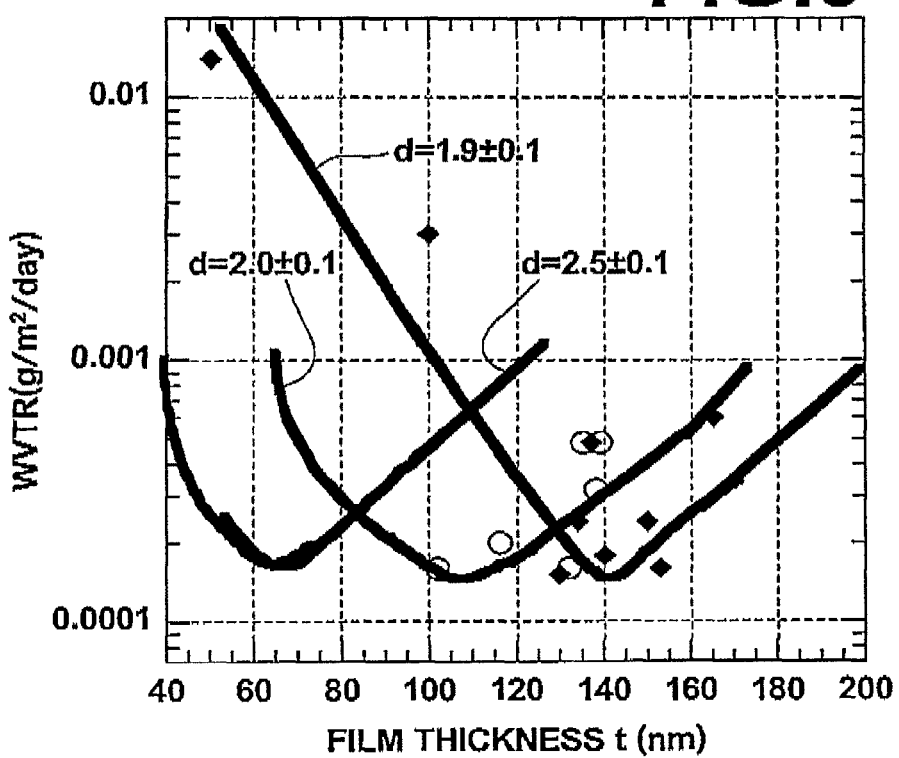
FIG. 3 is a graph indicating a relationship between the thickness and the water-vapor transmission rate of each of silicon-nitrogen compound films having different densities.

First, silicon-nitrogen compound films having different thicknesses and the densities of 1.9±0.1 $g/cm^3$, 2.2±0.1 $g/cm^3$, and 2.5±0.1 $g/cm^3$ have been produced, and the WVTR values of the silicon-nitrogen compound films having different thicknesses have been measured for each density. From the viewpoint of the resistance to aging of the film which alters the composition, it is considered preferable that the density of the silicon-nitrogen compound film be 1.9±0.1 $g/cm^3$ or greater. In the silicon-nitrogen compound films having the density of 2.5±0.1 $g/cm^3$ and the thickness greater then 120 nm, cracks have been produced during the process of measuring the WVTR value, so that the WVTR value has not been able to be measured. Therefore, the present inventors have determined that the density be preferably 2.5±0.1 $g/cm^3$ or smaller. FIG. 3 indicates the relationship obtained as above between the thickness and the WVTR for each density.

FIG. 3 shows a tendency for the WVTR value of the silicon-nitrogen compound film having each density to decrease with increase in the thickness when the thickness is smaller than a certain value, and increases with increase in the thickness when the thickness is greater than the certain value. This is because when the thickness is too small, the energy barrier height is too small and therefore water molecules in the air and the like are likely to penetrate through the film, and because the stress imposed on the silicon-nitrogen compound film increases with increase in the thickness and therefore cracks are likely to be produced by the stress. Although no cracks have been found by visual observation using an optical microscope in the thickness range indicated in FIG. 3, it is considered that the WVTR value increases when the thickness is greater than the certain value because very small gaps are produced in the silicon-nitrogen compound films by the stress.

Figure 4:
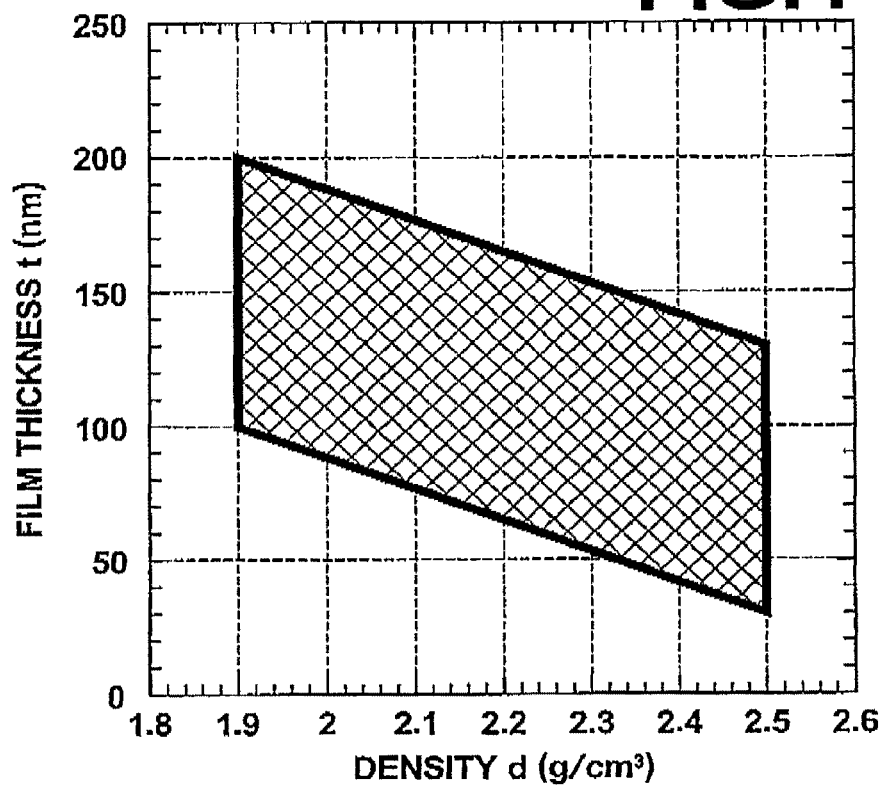
FIG. 4 is a diagram indicating ranges of the thickness and the density of the silicon-nitrogen compound film of which the water-vapor transmission rate does not exceed 10$^{-3}$ g/m$^2$/day.

FIG. 4 indicates the ranges of the thickness and the density of the silicon-nitrogen compound film of which the WVTR does not exceed $10^{-3}$ g/m$^2$/day, which are plotted on the basis of the results indicated in FIG. 3. The WVTR values of the silicon-nitrogen compound films having the thickness and density falling in the crosshatched region in FIG. 4 do not exceed $10^{-3}$ g/m$^2$/day. The thickness and density falling in the crosshatched region in FIG. 4 satisfy the aforementioned inequalities (1) and (2).

$$1.9 \leq d \leq 2.5, \text{ and} \tag{1}$$

$$-700d+1930 \leq 6t \leq -700d+2530. \tag{2}$$

Since the silicon-nitrogen compound film according to the present invention satisfies the inequalities (1) and (2), the WVTR of the silicon-nitrogen compound film according to the present invention does not exceed $10^{-3}$ g/m$^2$/day. From the viewpoint of the productivity and the proneness to crack formation, the thickness t is preferably small, and particularly preferably 100 nm or smaller.

As explained above, according to the present invention, it is possible to produce a silicon-nitrogen compound film having a water-vapor transmission rate not exceeding $10^{-3}$ g/m$^2$/day (i.e., exhibiting superior gas-barrier performance) can be produced by preferably setting the molar amounts of oxygen atoms and hydrogen atoms in the silicon-nitrogen compound film and the thickness and the density of the silicon-nitrogen compound film. Such a silicon-nitrogen compound film is preferable for use as a gas-barrier film in a thin-film device such as an organic EL device.

2. Gas-barrier Film

Next, a gas-barrier film according to an embodiment of the present invention which uses the silicon-nitrogen compound film according to the present invention is explained below with reference to FIG. 5, which schematically shows a cross section, across the thickness, of the gas-barrier film.

2.1 Structure of Gas-barrier Film

The gas-barrier film according to the present embodiment can suppress penetration of air and water vapor into a device or the like having a resin substrate or a base in which one or more organic layers are arranged. Specifically, in FIG. 5, reference number 10 denotes a base, and 3 denotes the gas-barrier film. The base 10 is a resin substrate or a base in which one or more organic layers are arranged. In the example explained below, the base 10 is assumed to be a resin substrate. The gas-barrier film 3 is realized by alternately forming one or more silicon-nitrogen compound films 1 and one or more organic films 2 over the upper surface of the resin substrate 10. Each of the one or more silicon-nitrogen compound films 1 in FIG. 5 is the silicon-nitrogen compound film according to the present invention.

The one or more organic films 2 are layers arranged for reducing the membrane stress imposed on the one or more silicon-nitrogen compound films 1, where the membrane stress is caused by bending and the like. Although the gas-barrier film 3 is formed on the upper surface of the resin substrate 10 in the example of FIG. 5, the gas-barrier film 3 may be formed on the lower surface or each of the upper and lower surfaces of the resin substrate 10.

Each of the uppermost layer in the alternately laminated structure of the one or more silicon-nitrogen compound films 1 and the one or more organic films 2 and the lowermost layer in the alternately laminated structure (which is formed directly on the upper surface of the resin substrate 10) may be either a silicon-nitrogen compound film or an organic film as long as the one or more silicon-nitrogen compound films 1 and the one or more organic films 2 are alternately formed. In the case where protrusions and recesses exist at the upper or lower surface of the resin substrate 10, it is preferable that the lowermost one of the one or more organic films 2 be directly formed on the upper or lower surface of the resin substrate 10 in order to moderate the influence of the protrusions and recesses. Further, from the viewpoint of the adhesiveness to a layer to be formed on the uppermost layer in the alternately laminated structure, the uppermost layer in the alternately laminated structure be preferably the uppermost one of the one or more organic films 2.

As explained before, since each of the one or more silicon-nitrogen compound films 1 has poor flexibility, the thickness of the silicon-nitrogen compound film is limited so that cracks are not produced by membrane stress. Therefore, the gas-barrier performance of each of the one or more silicon-nitrogen compound films 1 is limited. However, since the one or more silicon-nitrogen compound films 1 are laminated through the one or more organic films 2 as illustrated in FIG. 5, the alternately laminated structure, as a whole, exhibits gas-barrier performance equivalent to the gas-barrier performance of a single silicon-nitrogen compound film having a thickness equal to the total thickness of the one or more silicon-nitrogen compound films 1 in the gas-barrier film 3 of FIG. 5.

As explained later, each of the one or more organic films 2 has a sufficiently great thickness compared with the thickness of each of the one or more silicon-nitrogen compound films 1. Therefore, the rigidity of each of the one or more organic films 2 is far greater than the rigidity of each of the one or more silicon-nitrogen compound films 1, so that the flexibility is determined by the one or more organic films 2. Thus, the shearing stress S (N/m$^2$) acting on each of the interfaces between the one or more silicon-nitrogen compound films 1 and the one or more organic films 2 is determined by only the rigidity of the one or more silicon-nitrogen compound films 1. In addition, when one of the one or more silicon-nitrogen compound films 1 is sandwiched by two of the organic films 2, the silicon-nitrogen compound film is evenly supported by the two organic films, so that the stress imposed on the silicon-nitrogen compound film is reduced by half. Consequently, it is preferable that the one or more silicon-nitrogen compound films 1 be laminated through the one or more organic films 2.

Although the number of the one or more silicon-nitrogen compound films 1 constituting the gas-barrier film 3 is not specifically limited, the number of the one or more silicon-nitrogen compound films 1 is preferably 2 to 30, and more preferably 3 to 20. It is possible to determine the number of the one or more silicon-nitrogen compound films 1 as appropriate according to a desired WVTR value. As mentioned before, the upper limit of the WVTR value currently required in the organic EL devices is $10^{-6}$ g/m$^2$/day. In the case where each of the one or more silicon-nitrogen compound films 1 has a WVTR value of approximately $10^{-3}$ g/m$^2$/day, it is possible to achieve the WVTR value of $10^{-6}$ g/m$^2$/day by laminating two silicon-nitrogen compound films 1 in the gas-barrier film 3. The one or more silicon-nitrogen compound films 1 may be arranged on only one (upper or lower) side of the resin substrate 10 or on both (upper and lower) sides of the resin substrate 10.

The resin substrate 10 is not specifically limited, and it is possible to choose the resin substrate 10 as appropriate according to the use of the resin substrate 10. Specifically, the resin substrate 10 may be made of a thermoplastic resin, which is, for example, an arbitrary one of a polyester (e.g., polyethylene terephthalate (PET) or polyethylene naphthalate (PEN)), an acrylic resin (such as a methacrylic resin), a copolymer of methacrylic acid and maleic acid, polystyrene, a fluorine-containing resin, a polyimide, a fluorinated polyimide, a polyamide, a polyamide-imide, polyetherimide, a cellulose acylate, a polyurethane, a polyetherketone, polycarbonate, alicyclic polyolefin, polyallylate, polyethersulfone, polysulfone, fluorene-ring modified polycarbonate, alicyclic modified polycarbonate, a fluorene-ring modified polyester, and an acryloyl compound.

The thickness of the resin substrate 10 is not specifically limited, and it is possible to choose the thickness of the resin substrate 10 as appropriate according to the use of the resin substrate 10. The thickness of the resin substrate 10 is typically 1 to 800 micrometers, and preferably 10 to 200 micrometers.

In addition, it is possible to arrange various functional layers (such as a conductive layer or a primer layer) on the upper and/or lower surface of the resin substrate 10. The functional layers may include the layers disclosed in paragraphs Nos. 0075 to 0078 in U.S. Patent Application Publication No. 20060251905), a mat-agent layer, a protection layer, an antistatic layer, a smoothing layer, an adhesion-improving layer, a shading layer, an antireflection layer, a hard-coat layer, a stress-relaxation layer, an antidim layer, an anti-mud layer, a printed layer, and the like.

As mentioned before, the one or more organic films 2 are layers for relaxing the membrane stress which is imposed on the one or more silicon-nitrogen compound films 1 by bending or the like. Although the one or more organic films 2 are not specifically limited as long as the one or more organic films 2 have the above function of relaxing the membrane stress, the one or more organic films 2 can be normally realized by resin films. From the viewpoint of the ease of film formation, the resin films are preferably formed of a thermoplastic resin, which may be one of the examples of the thermoplastic resins mentioned before for the resin substrate 10.

The one or more organic films 2 can be formed by vacuum film formation, application of a solution, and the like. The vacuum film-formation techniques include evaporation, plasma CVD (chemical vapor deposition), and the like. The application of a solution may be performed by dip coating, air-knife coating, curtain coating, roller coating, wire-bar coating, gravure coating, slide coating, and the like. In addition, the extrusion coating using a hopper as disclosed in U.S. Pat. No. 2,681,294 and similar techniques can also be used for application of a solution. In the case where the application of a solution is used, and the one or more organic films 2 are resin layers, the one or more organic films 2 may be formed by applying a solution of a resin in an organic solvent and thereafter drying the applied solution, or applying a solution containing a precursor (e.g., an oligomer or a monomer) of a resin in an organic solvent and thereafter polymerizing the precursor in the applied solution. In the latter case, the solution containing the precursor may contain a polymerization initiator, a chain transfer agent, or the like when necessary.

Various monomers including methacrylate monomers, acrylate monomers, and the like can be used in formation of the one or more organic films 2 by applying a solution containing a monomer and polymerizing the monomer. For example, the methacrylate monomers and the acrylate monomers disclosed in U.S. Pat. Nos. 6,083,628 and 6,214,422 can be preferably used.

Although the manner of the polymerization of the monomer is not specifically limited, heat polymerization, photopolymerization (for example, with ultraviolet or visible light), electron-beam polymerization, plasma polymerization, or a combination of these polymerization techniques can be used. The manner of the polymerization and the initiator can be chosen as appropriate according to the type of the monomer.

For example, in the case of the photopolymerization, photopolymerization initiators can be used as the polymerization initiators. Examples of the photopolymerization initiators are the Irgacure series initiators (including Irgacure 651, Irgacure 754n, Irgacure 184, Irgacure 2959, Irgacure 907, Irgacure 369, Irgacure 379, and Irgacure 819), the Darocur series initiators (including Darocur TPO and Darocur 1173), Quantacure PDO, and the Esacure series initiators (including Esacure TZM and Esacure TZT), where the Irgacure series initiators, the Darocur series initiators, and Quantacure PDO are products of Chiba Japan K.K. and the Esacure series initiators are products of Sartomer Company, Inc. Irgacure and Darocur are registered trademarks of Chiba Holding Inc., and Esacure is a registered trademark of Lamberti SPA. In the case where the above photopolymerization initiators are used, polymerization proceeds when the monomer is irradiated with ultraviolet light, which can be emitted from a commercially available, high-pressure or low-pressure mercury-vapor lamp.

Since existence of oxygen impedes polymerization of acrylate monomers and methacrylate monomers, it is preferable that the concentration or partial pressure of oxygen be maintained low during the polymerization. When the polymerization is insufficient, part of the monomer which remains in the organic films 2 after reaction accelerates aging of the organic films 2. Therefore, the polymerization yield is preferably 80% or more, more preferably 85% or more, and further preferably 90% or more. The polymerization yield is the ratio of the amount of the polymerized group in a monomer-polymer mixture after the polymerization process to the initial amount of the polymerizable group in a monomer mixture before the polymerization process. For example, the polymerizable group is the acryloyl group in the acrylate monomer, and the methacryloyl group in the acrylate monomer. The polymerization yield (degree of cure) Y (%) can be calculated on the basis of the ratio between the infrared absorption intensities at the peak around the wave number 1720 $cm^{-1}$ originated from the carbonyl group before and after the polymerization (curing) process and the ratio between the infrared absorption intensities at the peak around the wave number 810 $cm^{-1}$ originated from the carbon-carbon double bond before and after the polymerization (curing) process in accordance with the formula, $$Y(\%)=\{(a \times d - b \times c)/(a \times d)\} \times 100 \quad (3)$$

where a represents the intensity of the peak around 1720 $cm^{-1}$ of a cured film (after the polymerization), b represents the intensity of the peak around 810 $cm^{-1}$ of the cured film (after the polymerization), c represents the intensity of the peak around 1720 $cm^{-1}$ of a monomer mixture (before the polymerization), and d represents the intensity of the peak around 810 $cm^{-1}$ of the monomer mixture (before the polymerization).

The oxygen concentration can be lowered by the conventional nitrogen substitution technique or the like. In this case, the oxygen concentration is preferably 2% or lower, and more preferably 0.5% or lower. In addition, the partial pressure of oxygen can be lowered by the conventional pressure reduction technique or the like. In this case, the total pressure of the polymerization system is preferably 1000 Pa or lower, and more preferably 100 Pa or lower. In the case where photopolymerization is performed by the conventional pressure reduction technique at a low pressure of 100 Pa or lower, the irradiation energy is preferably 2 $J/cm^2$ or greater.

It is preferable that the one or more organic films 2 have high smoothness. Specifically, the arithmetic average surface roughness Ra in an area of 10-micrometer square of each organic films is preferably 10 nm or smaller, and more preferably 2 nm or smaller. The surface roughness can be measured by an atomic force microscope (AEM). In this case, the arithmetic average surface roughness Ra (nm) in a measurement area of 1-micrometer square can be obtained. The present inventors have used the AFM, SPI3800N/SPA400 and the cantilever SI-DF20 (which are available from SII NanoTechnology Inc.), and performed the measurement at the operational frequency of 1 Hz, and obtained data along 256 lines in the X and Y directions.

In addition, it is preferable that the hardness of the one or more organic films 2 be high. Specifically, the hardness of the one or more organic films 2 is preferably the pencil hardness "HB" or higher, and more preferably "H" or higher.

The thickness of each organic film 2 is not specifically limited. However, in the case where the thickness of each organic film 2 is too small, it is difficult to achieve uniform thickness. On the other hand, in the case where the thickness of each organic film 2 is too great, cracks can be produced by membrane stress caused by bending or the like although the one or more organic films 2 have high flexibility. Therefore, the thickness of each organic film 2 is preferably 300 nm to 2 μm, and more preferably 500 nm to 1 μm.

2.2 Apparatus for Film Formation

As mentioned before, each of the one or more silicon-nitrogen compound films 1 constituting the gas-barrier film 3 is the silicon-nitrogen compound film according to the present invention. Although the manner of formation of the one or more silicon-nitrogen compound films 1 is not specifically limited, the one or more silicon-nitrogen compound films 1 may be formed by sputtering, ion plating, plasma CVD, or the like. Specifically, the film-formation techniques disclosed in Japanese Registered Patent No. 3400324 and Japanese Unexamined Patent Publications Nos. 2002-322561 and 2002-361774 can be used.

Figure 6:
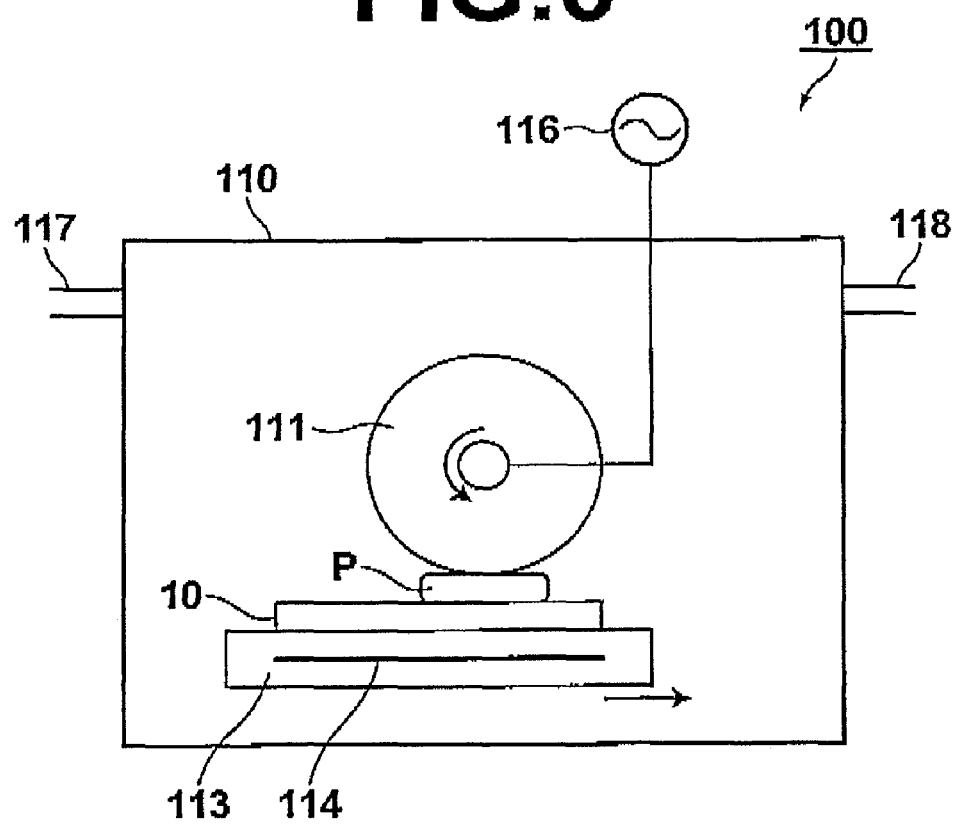
FIG. 6 is a schematic diagram illustrating an example of a plasma CVD apparatus which is used for formation of a silicon-nitrogen compound film according to the present invention and has a rotary electrode.
Figure 7:
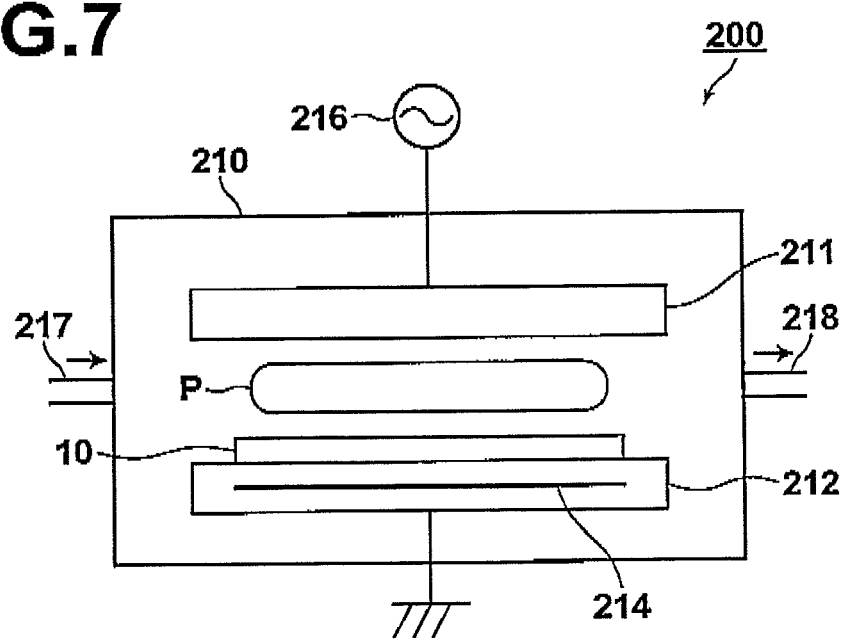
FIG. 7 is a schematic diagram illustrating an example of a plasma CVD apparatus which is used for formation of a silicon-nitrogen compound film according to the present invention and has parallel planar electrodes.

In the case where the one or more silicon-nitrogen compound films 1 are formed by plasma CVD, for example, the plasma CVD apparatuses illustrated in FIGS. 6 and 7 can be used. FIGS. 6 and 7 schematically show examples of plasma CVD apparatuses which can be used for formation of a silicon-nitrogen compound film according to the present invention.

The plasma CVD apparatus 100 of FIG. 6 comprises a rotary electrode, and can continuously form a film over the resin substrate 10 in the case where the resin substrate 10 has a form of a rolled film. That is, the plasma CVD apparatus 100 can be preferably used in the case where a resin film substrate is used as in the present embodiment.

The plasma CVD apparatus 100 comprises a reactor chamber 110, which has a gas inlet 117 and a gas outlet 118. In the reactor chamber 110, a movable substrate stage 113 and a cylindrical rotary electrode 111 are arranged. A heater 114 is arranged in the substrate stage 113, and the rotary electrode 111 is driven by a high-frequency power supply 116. A resin substrate 10 is placed on the substrate stage 113. When a high-frequency voltage is applied to the rotary electrode 111, a plasma space P is produced between the rotary electrode 111 and the resin substrate 10 on the substrate stage 113, so that it is possible to form on the resin substrate 10 a film containing constituent elements of raw-material gas, which is supplied through the gas inlet 117. When the substrate stage 113 is moved, the resin substrate 10 is moved with a predetermined tension imposed on the resin substrate 10, so that the film can be continuously formed.

When the above plasma CVD apparatus 100 is used, raw-material gas containing $SiH_4$, $NH_3$, $H_2$, and He, raw-material gas containing $SiH_4$, $NH_3$, $H_2$, and $N_2$, or similar raw-material gas can be used. The composition of the raw-material gas is determined according to the composition of the film to be formed. When the raw-material gas is supplied to the reactor chamber 110, it is possible to produce plasma and form the film in an atmosphere at the total pressure of 1,000 to 100,000 Pa, for example, under the condition that the plasma power density is 350 $W/cm^2$, the frequency of the high-frequency voltage is 150 MHz, the substrate temperature is room temperature, and the substrate-electrode distance is 800 micrometers.

The plasma CVD apparatus 200 of FIG. 7 uses parallel planar electrodes, and is commonly used. The plasma CVD apparatus 200 comprises a reactor chamber 210, which has a gas inlet 217 and a gas outlet 218. In the reactor chamber 210, first and second planar electrodes 211 and 212 are arranged in parallel. A heater 214 is arranged in the second planar electrode 212, and a high-frequency voltage is applied from a high-frequency power supply 216 to the first planar electrode 211. The plasma CVD apparatus 200 of FIG. 7 has an approximately similar construction to the plasma CVD apparatus 100 of FIG. 6 except for the structure of the electrode. Therefore, it is possible to form the one or more silicon-nitrogen compound films 1 by using the plasma CVD apparatus 200 in a similar manner to the film formation by use of the plasma CVD apparatus 100.

2.3 Advantage of Gas-barrier Film

As mentioned before, the gas-barrier film 3 according to the present embodiment is constituted by the alternately laminated structure of the one or more silicon-nitrogen compound films 1 and the one or more organic films 2 which is formed on the resin substrate 10, and each of the one or more silicon-nitrogen compound films 1 has the WVTR (water vapor transmission rate) value not exceeding $10^{-3}$ $g/m^2/day$. Therefore, the gas-barrier film 3 constituted by the one or more silicon-nitrogen compound films 1 exhibits satisfactory gas-barrier performance. The gas-barrier film 3 according to the present embodiment can be produced so as to exhibit desired gas-barrier performance (for example, a desired WVTR value not exceeding $10^{-6}$ $g/m^2/day$) by appropriately setting the number of the one or more silicon-nitrogen compound films 1.

Figure 5:
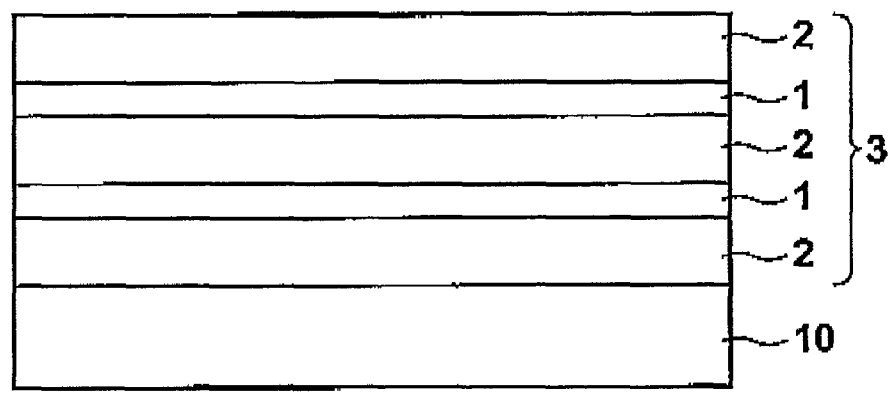
FIG. 5 is a schematic cross-sectional view of a gas-barrier film according to an embodiment of the present invention.

2.4 Variations of Gas-barrier Film (1) Although the boundaries (interfaces) between the one or more silicon-nitrogen compound films 1 and the one or more organic films 2 in the gas-barrier film 3 illustrated in FIG. 5 are definite, the boundaries may not be necessarily definite. For example, the gas-barrier film 3 contains a region in which the organic material constituting the one or more organic films 2 and the inorganic material constituting the one or more silicon-nitrogen compound films 1 are mixed. In such a gas-barrier film, the functions of the silicon-nitrogen compound film and the organic film are integrated, and the gas-barrier film 3 can be produced so that the entire gas-barrier film 3 has the desired WVTR value. For example, the mixing ratio of the inorganic material constituting the one or more silicon-nitrogen compound films 1 and the organic material constituting the one or more organic films organic films 2 may be continuously varied across the thickness, as disclosed by T. W. Kim et al., "Transparent hybrid inorganic/organic barrier coatings for plastic organic light-emitting diode substrates", Journal of vacuum Science and Technology A, Vol. 23, No. 4, pp. 971-977, 2005. In addition, U.S. Patent Application Publication No. 20040046497 discloses a structure in which an organic material and an inorganic material are continuously laminated without a boundary between an organic layer and an inorganic layer. In the gas-barrier film 3 which contains a region in which an organic material and an inorganic material are mixed, it is preferable that one or more regions which are rich in the organic material and one or more regions which are rich in the inorganic material alternately appear across the thickness of the gas-barrier film 3.

(2) Although the uppermost layer of the gas-barrier film 3 is preferably the uppermost one of the one or more organic films 2 as mentioned before, it is possible to further arrange various functional layers over the uppermost one of the one or more organic films 2. The functional layers over the uppermost one of the one or more organic films 2 may be one of the layers which are referred to before as the examples of the functional layers which can be formed over the upper and/or lower surface of the resin substrate 10.

(3) Although the base 10, on which the alternately laminated structure of the one or more silicon-nitrogen compound films 1 and the one or more organic films 2 is formed, is a resin substrate in the example explained above, the base 10 may be generally a base in which one or more organic layers are arranged. For example, the base 10 constituted by a lamination of one or more inorganic layers and one or more organic layers, or the base 10 having various functional layers, wirings, and the like can also be used.

3. Thin-film Device

Figure 8:
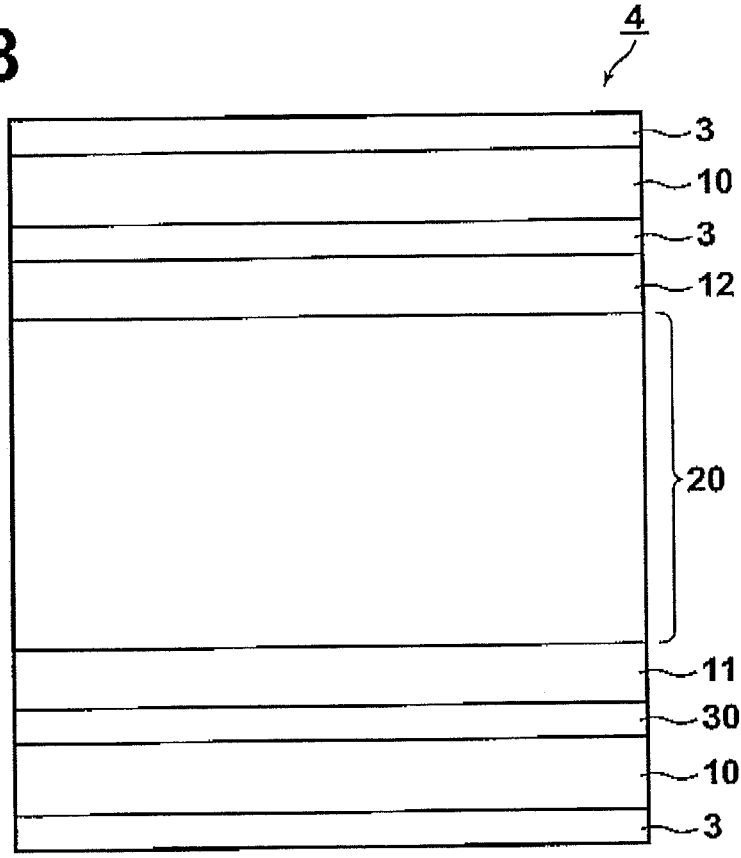
FIG. 8 is a schematic cross-sectional view of a thin-film device (organic EL device) according to an embodiment of the present invention.

Next, an example of a thin-film device having the gas-barrier film 3 according to the present invention is explained below with reference to FIG. 8, which schematically shows a cross-section of a thin-film device according to an embodiment of the present invention. The thin-film device having the gas-barrier film 3 according to the present invention may be an image display device (such as an organic EL (electroluminescence) device, a liquid crystal display, or electronic paper), a dye-sensitized solar cell, a touchscreen, or the like. In the example of FIG. 8, the thin-film device is an organic EL device.

The organic EL device 4 of FIG. 8 comprises a lamination of a lower electrode 11, an organic EL layer 20, an upper electrode 12, and the lamination is sandwiched by a pair of resin substrates 10. The gas-barrier film 3 according to the present invention is formed on each of the upper and lower surfaces of each resin substrate 10. An image can be displayed on the lower side of the organic EL device 4.

As mentioned before, when the gas-barrier film 3 is used in an organic EL device, it is preferable that the gas-barrier film 3 have a WVTR value not exceeding $10^{-6}$ g/m$^2$/day. Therefore, the number of the one or more silicon-nitrogen compound films 1 contained in the gas-barrier films 3 in the organic EL device 4 is set so as to realize the above WVTR value.

The materials and the structures of the lower electrode 11 and the upper electrode 12 may be as explained in paragraphs Nos. 0087 to 0104 in U.S. Patent Application Publication No. 20060251905, and the organic EL layer 20 in the organic EL device 4 corresponds to the organic compound layer explained in paragraphs Nos. 0105 to 0134 in U.S. Patent Application Publication No. 20060251905.

Since the gas-barrier films 3 in the organic EL device 4 have the WVTR value not exceeding $10^{-6}$ g/m$^2$/day, it is possible to highly suppress penetration of air and water vapor into the device. Although the organic EL devices are vulnerable to influence of water vapor and oxygen, the characteristics of the organic EL device 4 according to the present embodiment are unlikely to be affected by water vapor and oxygen, so that the organic EL device 4 according to the present embodiment can maintain satisfactory element characteristics with high reliability.

4. Evaluation of Concrete Example

The present inventors have produced concrete examples of the silicon-nitrogen compound film according to the present invention, as indicated below.

4.1 Concrete Example 1

The concrete example 1 of the silicon-nitrogen compound film according to the present invention has been formed on a film substrate of PEN (polyethylene naphthalate) by using the plasma CVD apparatus 100 illustrated in FIG. 6 under the condition that the RF power is 600 W, the pressure during the film formation is 10,000 Pa, the rotation speed of the rotary electrode 111 is 5,000 rpm, and the substrate temperature is room temperature. Specifically, samples A, B, C, and D of the silicon-nitrogen compound film having a thickness of 100 nm and different compositions have been produced by using raw-material gas having different gas composition (mixing ratios). In the raw-material gas, 0.05 volume percent SiH4, 1 volume percent NH3, and x volume percent $H_2$ are mixed with He gas, where the volume fractions x of $H_2$ in the samples A, B, C, and D are 1%, 5%, 10%, and 20%, respectively.

Figure 9:
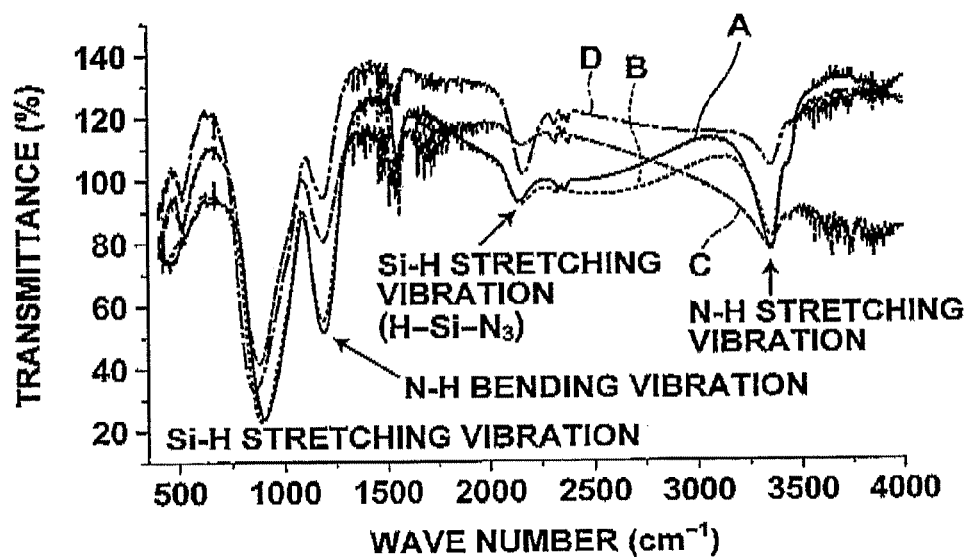
FIG. 9 is a graph indicating FTIR spectra of samples of silicon-nitrogen compound films produced as concrete examples 1.
Figure 10:
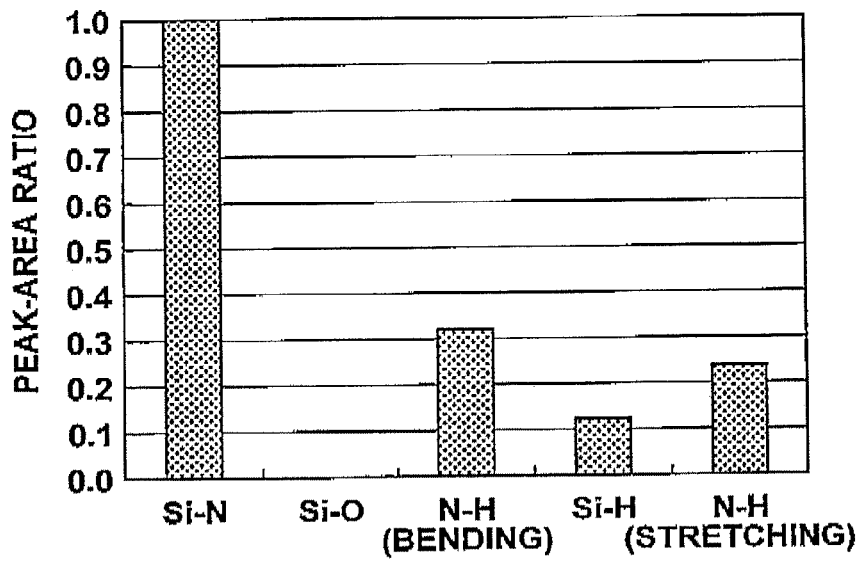
FIG. 10 is a graph indicating the relative peak areas in the FTIR spectrum of the sample A indicated in FIG. 9, where the peak areas are normalized so that the area of the peak corresponding to the Si—N stretching vibration is normalized to one.

The compositions of the samples A, B, C, and D have been analyzed by infrared spectroscopy. FIG. 9 shows the FTIR (Fourier-transform infrared) absorption spectra of the samples A, B, C, and D, and FIG. 10 shows the relative peak areas in the FTIR spectrum of the sample A indicated in FIG. 9, where the peak areas are obtained from the peak appearing near the wave number of 810 cm$^{-1}$ in the FTIR absorption spectrum and corresponding to a Si—N stretching vibration, the peak appearing near the wave number of 1000 cm$^{-1}$ to 1050 cm$^{-1}$ in the FTIR absorption spectrum and corresponding to a Si—O stretching vibration, the peak appearing near the wave number of 1050 cm$^{-1}$ in the FTIR absorption spectrum and corresponding to a N–H bending vibration, and the peak appearing near the wave number of 2150 cm$^{-1}$ in the FTIR absorption spectrum and corresponding to a Si—H stretching vibration, and the peak areas are normalized so that the area of the peak corresponding to the Si—N stretching vibration is normalized to one. In addition, FIG. 10 shows that the ratio Sh/Sn of the area Sh of the peak corresponding to the Si—H stretching vibration to the area Sn of the peak corresponding to the Si—N stretching vibration in the FTIR spectrum of the sample A (formed by using the raw-material gas containing 1% $H_2$) is approximately 0.12.

Next, the density d of the sample A has been measured to be 2.4±0.1 g/cm$^3$.

Further, the WVTR value of the sample A has been obtained as $5 \times 10^{-4}$ g/m$^2$/day by measurement (at the measurement temperature of 40° C. and the relative humidity of 90%) by use of the aforementioned instrument PERMATRAN-W3/31, and calculation for supplementation based on the variations in the optical density of metal calcium. That is, the WVTR value of the sample A has been confirmed not to exceed $10^{-3}$ g/m$^2$/day.

Thus, the sample A (formed by using the raw-material gas containing 1% $H_2$) has been confirmed to satisfy the conditions for the silicon-nitrogen compound film according to the first aspect of the present invention. Therefore, the sample A has been confirmed to be effective as a gas barrier.

4.2 Concrete Example 2

The concrete example 2 of the silicon-nitrogen compound film according to the present invention has been formed on a film substrate of PEN by using the plasma CVD apparatus 200 illustrated in FIG. 7 under the condition that the plasma power density is 350 W/cm$^2$, the pressure during the film formation is 100,000 Pa, the distance between the electrodes is 800 micrometers, and the substrate temperature is room temperature. Specifically, four different samples of the silicon-nitrogen compound film having a thickness of 100 nm and four different compositions have been produced in similar manners to the concrete example 1. Then, the compositions of the above samples have been analyzed by infrared spectroscopy, and FTIR absorption spectra similar to the FTIR absorption spectra of FIG. 9 have been obtained.

5. Industrial Usability

The silicon-nitrogen compound film according to the present invention can be preferably used in gas-barrier films in thin-film devices such as the image display devices (including organic EL devices, liquid crystal displays, and electronic paper), dye-sensitized solar cells, touchscreens, and the like.

What is claimed is:

1. A silicon-nitrogen compound film of a material expressed by a compositional formula $Si_3N_xO_yH_z$, where x, y, and z satisfy $10 \leq (3x+2y) \leq 12$, $3.4 \leq x \leq 4.0$, $0 \leq y$, and $0 < z < 2.0$, a peak-area ratio of a first area of a first peak appearing near a wave number of 2150 cm$^{-1}$ in a Fourier-transform infrared absorption spectrum of said material and corresponding to a Si—H stretching vibration to a second area of a second peak appearing near a wave number of 810 cm$^{-1}$ in the Fourier-transform infrared absorption spectrum and corresponding to a Si—N stretching vibration is smaller than 0.2, and said silicon-nitrogen compound film has a thickness t (in nanometers) and a density d (g/cm$^3$) which satisfy the inequalities, $1.9 \leq d \leq 2.5$, and $-700d+1930 \leq 6t \leq -700d+2530$.

2. A silicon-nitrogen compound film according to claim 1, having a water-vapor transmission rate not exceeding $1 \times 10^{-3}$ g/m$^2$ day.

3. A gas-barrier film comprising one or more silicon-nitrogen compound films and one or more organic films which are alternately laminated, where each of the one or more silicon-nitrogen compound films is said silicon-nitrogen compound film according to claim 1.

4. A gas-barrier film according to claim 3, having a water-vapor transmission rate not exceeding $10^{-6}$ g/m$^2$/day.

5. A thin-film device comprising:
a substrate having one or more organic films; and
said gas-barrier film according to claim 3 formed over said substrate.

* * * * *